United States Patent
Reddy et al.

(10) Patent No.: US 9,965,199 B2
(45) Date of Patent: May 8, 2018

(54) SMART DYNAMIC WEAR BALANCING BETWEEN MEMORY POOLS

(71) Applicants: Gautham Reddy, San Jose, CA (US); Nian Niles Yang, Mountain View, CA (US); Alexandra Bauche, San Jose, CA (US); Nagdi Tafish, Santa Clara, CA (US); Michael Zhu, San Jose, CA (US)

(72) Inventors: Gautham Reddy, San Jose, CA (US); Nian Niles Yang, Mountain View, CA (US); Alexandra Bauche, San Jose, CA (US); Nagdi Tafish, Santa Clara, CA (US); Michael Zhu, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 851 days.

(21) Appl. No.: 13/973,162

(22) Filed: Aug. 22, 2013

(65) Prior Publication Data
US 2015/0058530 A1 Feb. 26, 2015

(51) Int. Cl.
| | |
|---|---|
| *G06F 12/02* | (2006.01) |
| *G06F 12/08* | (2016.01) |
| *G06F 12/12* | (2016.01) |
| *G06F 3/06* | (2006.01) |
| *G11C 29/00* | (2006.01) |
| *G11C 16/34* | (2006.01) |

(52) U.S. Cl.
CPC ............ *G06F 3/0616* (2013.01); *G06F 3/064* (2013.01); *G06F 3/0679* (2013.01); *G06F 3/0685* (2013.01); *G06F 12/0246* (2013.01); *G11C 16/349* (2013.01); *G11C 29/82* (2013.01); *G06F 2212/1036* (2013.01); *G06F 2212/7211* (2013.01)

(58) Field of Classification Search
None
See application file for complete search history.

(56) References Cited

U.S. PATENT DOCUMENTS

| | | | | |
|---|---|---|---|---|
| 6,081,447 | A | * 6/2000 | Lofgren | G06F 12/0246 365/185.02 |
| 7,948,798 | B1 | 5/2011 | Sheredy et al. | |
| 8,040,744 | B2 | * 10/2011 | Gorobets | G06F 12/0246 711/103 |
| 8,296,507 | B2 | * 10/2012 | Yeh | G06F 12/0246 711/103 |
| 8,843,697 | B2 | * 9/2014 | Kim | G06F 12/0246 711/103 |
| 9,317,367 | B2 | * 4/2016 | Gao | G06F 11/108 |
| 2010/0037006 | A1 | 2/2010 | Chen et al. | |
| 2010/0115192 | A1 | 5/2010 | Lee | |
| 2010/0205357 | A1 | 8/2010 | Mukaida | |
| 2011/0029808 | A1 | 2/2011 | Moshayedi | |

(Continued)

*Primary Examiner* — Reginald Bragdon
*Assistant Examiner* — Kimbleann Verdi
(74) *Attorney, Agent, or Firm* — Brinks Gilson & Lione (57) ABSTRACT

A memory system or flash card may include a dynamic system-level process for the management of blocks in the different memory pools. There may be spare blocks available to the pools that are over provisioned to the pool which increases the efficiency of data compaction and helps reduce the average hot count for that pool and compensate for the grown defects. The block wear and grown defects in each memory pool may be tracked so that remaining spare blocks can be re-allocated.

17 Claims, 8 Drawing Sheets

(56) References Cited

U.S. PATENT DOCUMENTS

| | | |
|---|---|---|
| 2011/0238892 A1 | 9/2011 | Tsai et al. |
| 2011/0271043 A1* | 11/2011 | Segal .................... G11C 29/82 711/103 |
| 2012/0030409 A1 | 2/2012 | Post et al. |
| 2012/0317337 A1 | 12/2012 | Johar et al. |
| 2012/0324299 A1 | 12/2012 | Moshayedi |
| 2013/0054878 A1 | 2/2013 | Lee et al. |

* cited by examiner

SMART DYNAMIC WEAR BALANCING BETWEEN MEMORY POOLS

TECHNICAL FIELD

This application relates generally to memory devices. More specifically, this application relates to the smart and dynamic management of blocks in non-volatile semiconductor flash memory.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device.

As the non-volatile memory cell scales to smaller dimensions with higher capacity per unit area, the cell endurance due to program and erase cycling, and disturbances (e.g. due to either read or program) may become more prominent. The defect level during the silicon process may become elevated as the cell dimension shrinks and process complexity increases. Accordingly, memory meeting high endurance requirements may be more difficult, which may further increase research and development costs for the technology scaling.

Memory blocks may be allocated to memory pools during format. The pools may identify a high endurance/high usage pool as compared with a lower endurance/low usage pool. In one embodiment, multi-level cell (MLC) memory may be the lower endurance/low usage pool while single level cell (SLC) blocks may be the high endurance/high usage pool. There may be pre-allocated blocks in the pools to compensate for grown defects. If either of the pools runs out of the pre-allocated blocks, the device or card may go into read only mode and may no longer be practically useful to the user.

SUMMARY

It may be desirable to improve the endurance of memory through a smart and dynamic system-level management of blocks in the different memory pools. There may be spare blocks available to the pools that are over provisioned to the pool which increases the efficiency of data compaction and helps reduce the average hot count for that pool and compensate for the grown defects. The block wear and grown defects in each memory pool may be tracked so that remaining spare blocks can be re-allocated. The smart and dynamic reallocation of spare blocks between different memory pools is accomplished by actively monitoring the block wear and grown defects in each pool, thereby efficiently using the remaining available resources resulting in longer card life and better user experience with reduced endurance requirements.

DETAILED DESCRIPTION

Figure 1:
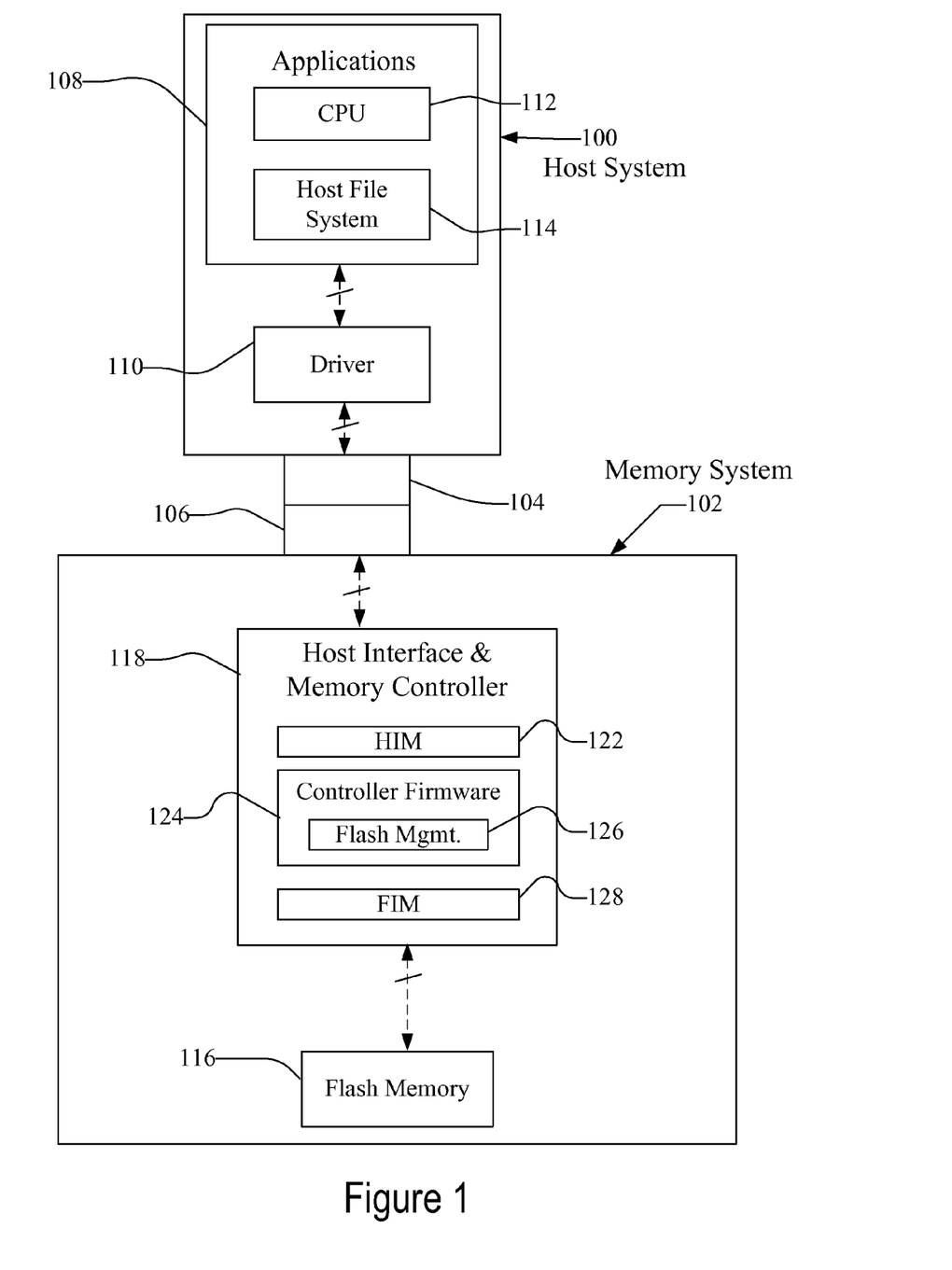
FIG. 1 is a block diagram of a host connected with a memory system having non-volatile memory.

A flash memory system suitable for use in implementing aspects of the invention is shown in FIGS. 1-6. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module 128. Flash management logic 126 may be part of the controller firmware 214 for internal memory management operations such as garbage collection. One or more flash interface modules (FIMs) 128 may provide a communication interface between the controller with the flash memory 116.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may be needed because: 1) the flash memory may have limited endurance; 2) the flash memory 116 may only be written in multiples of pages; and/or 3) the flash memory 116 may not be written unless it is erased as a block. The FTL understands these potential limitations of the flash memory 116 which may not be visible to the host 100. Accordingly, the FTL attempts to translate the writes from host 100 into writes into the flash memory 116.

The flash memory 116 or other memory may be multi-level cell (MLC) or single-level cell (SLC) memory. MLC and SLC memory are further described below. Either SLC or MLC may be included as part of the device controller 118 rather than as part of the flash memory 116.

As described below, MLC and SLC may be one example of pools of memory. The pools may be a high-usage pool (potentially at risk of failure) and a low-usage pool (less risk of failure). In one example, SLC memory is a high-usage pool and MLC is a low-usage pool. In other embodiments, there may be more or fewer memory pools and SLC/MLC is merely one example for distinguishing memory pools. In other embodiments, the pools may be the same type or different type of memory. Spare blocks may be allocated between the memory pools. Those spare blocks may be reallocated between pools based on active monitoring of block wear and grown defects. A grown defect is a block that becomes bad after usage. There may be bad blocks from manufacture (i.e. bad upon shipment) or bad blocks that are grown (grown defect). Grown defects may be identified based on the active monitoring. The active monitoring of block wear may be used for predicting when a block may become bad (i.e. grow a defect).

Figure 2:
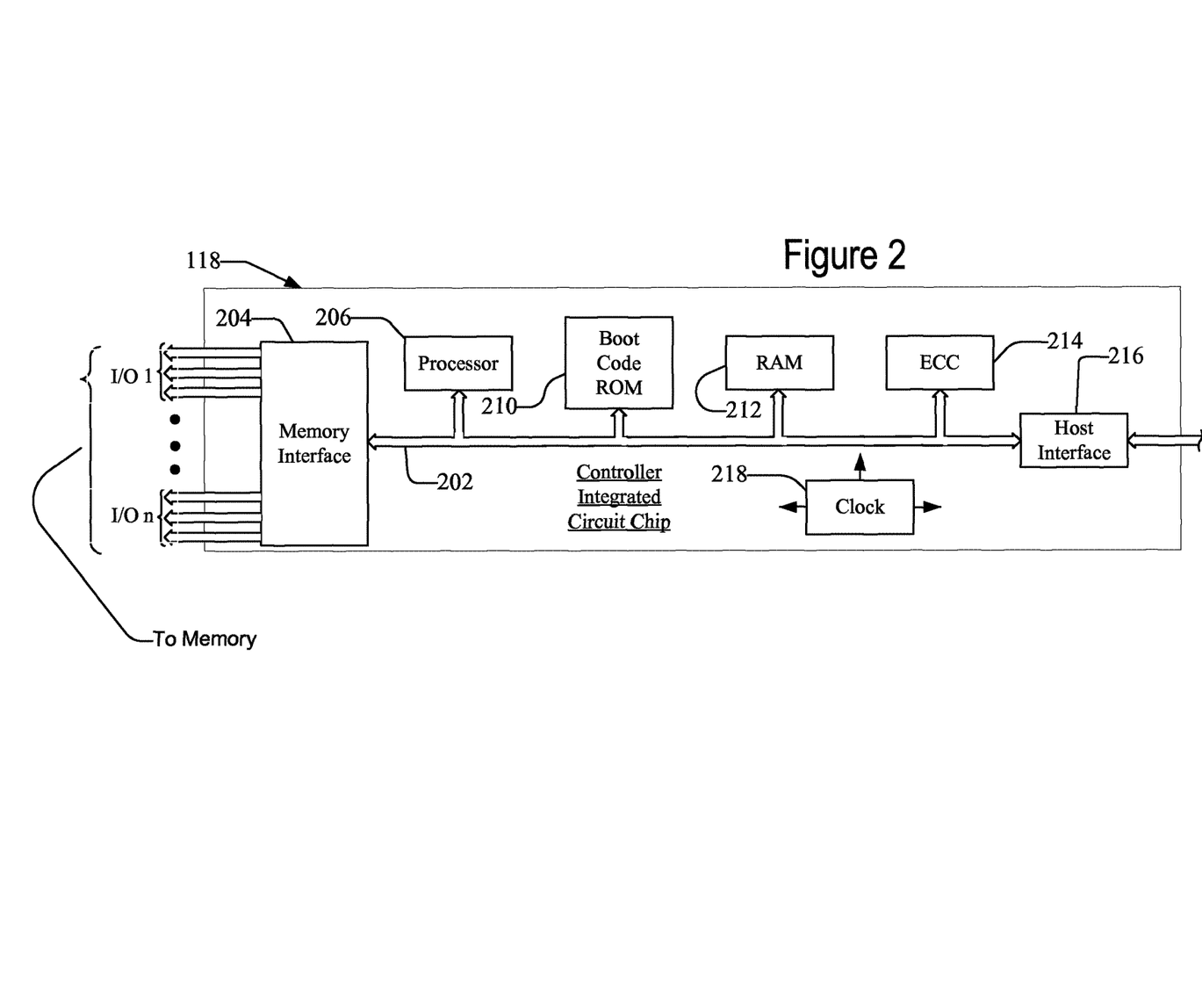
FIG. 2 is a block diagram of an exemplary flash memory device controller for use in the system of FIG. 1.

The device controller 118 may be implemented on a single integrated circuit chip, such as an application specific integrated circuit (ASIC) such as shown in FIG. 2. The processor 206 of the device controller 118 may be configured as a multi-thread processor capable of communicating via a memory interface 204 having I/O ports for each memory bank in the flash memory 116. The device controller 118 may include an internal clock 218. The processor 206 communicates with an error correction code (ECC) module 214, a RAM buffer 212, a host interface 216, and boot code ROM 210 via an internal data bus 202.

The host interface 216 may provide the data connection with the host. The memory interface 204 may be one or more FIMs 128 from FIG. 1. The memory interface 204 allows the device controller 118 to communicate with the flash memory 116. The RAM 212 may be a static random-access memory (SRAM). The ROM 210 may be used to initialize a memory system 102, such as a flash memory device. The memory system 102 that is initialized may be referred to as a card. The ROM 210 in FIG. 2 may be a region of read only memory whose purpose is to provide boot code to the RAM for processing a program, such as the initialization and booting of the memory system 102. The ROM may be present in the ASIC rather than the flash memory chip.

Figure 3:
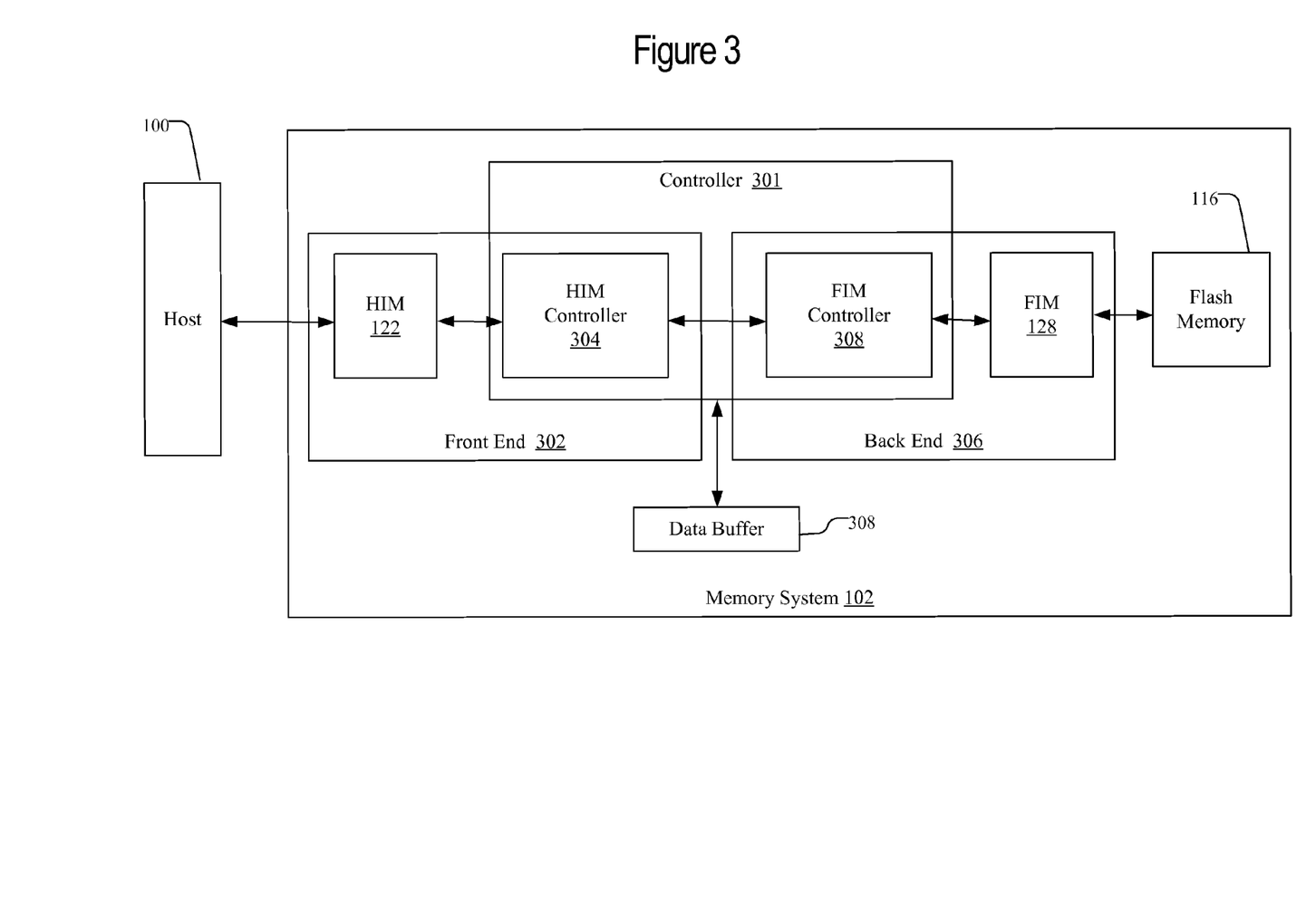
FIG. 3 is a block diagram of an alternative memory communication system.

FIG. 3 is a block diagram of an alternative memory communication system. The host system 100 is in communication with the memory system 102 as discussed with respect to FIG. 1. The memory system 102 includes a front end 302 and a back end 306 coupled with the flash memory 116. In one embodiment, the front end 302 and the back end 306 may be referred to as the memory controller and may be part of the device controller 118. The front end 302 may logically include a Host Interface Module (HIM) 122 and a HIM controller 304. The back end 306 may logically include a Flash Interface Module (FIM) 128 and a FIM controller 308. Accordingly, the controller 301 may be logically portioned into two modules, the HIM controller 304 and the FIM controller 308. The HIM 122 provides interface functionality for the host device 100, and the FIM 128 provides interface functionality for the flash memory 116. The controller 301 may be coupled with a data buffer 308. The FIM controller 308 may include the algorithms implementing the learning phase and implementation phase as described below with respect to FIGS. 7-10.

In operation, data is received from the HIM 122 by the HIM controller 304 during a write operation of host device 100 on the memory system 102. The HIM controller 304 may pass control of data received to the FIM controller 308, which may include the FTL discussed above. The FIM controller 308 may determine how the received data is to be written onto the flash memory 116 optimally. The received data may be provided to the FIM 128 by the FIM controller 308 for writing data onto the flash memory 116 based on the determination made by the FIM controller 308. In particular, depending on the categorization of the data it may be written differently (e.g. to MLC or retained in an update block).

Figure 4:
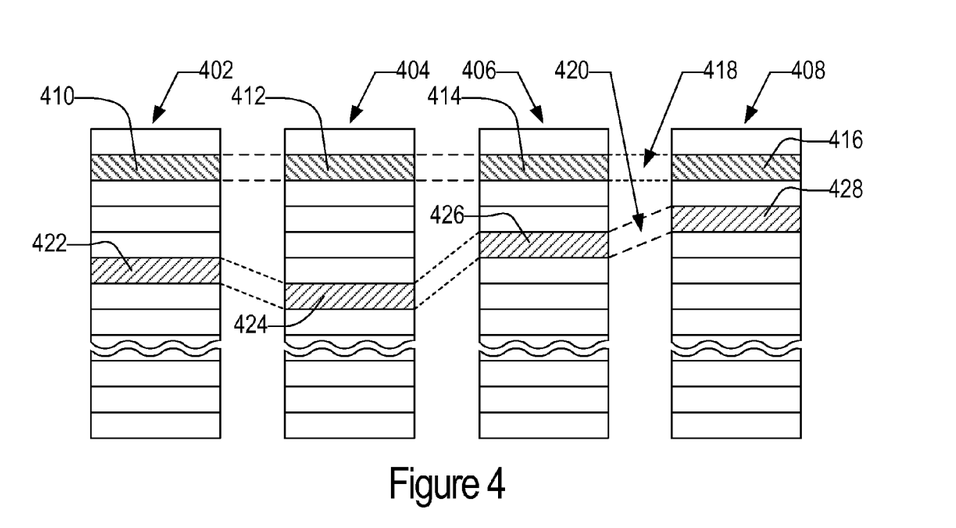
FIG. 4 is an example physical memory organization of the system of FIG. 1.

FIG. 4 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 402, 404, 406, and 408 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 4 by rectangles, such as blocks 410, 412, 414, and 416, located in respective planes 402, 404, 406, and 408. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 410, 412, 414, and 416 are shown to form one metablock 418. All of the cells within a metablock are typically erased together. The blocks used to form a metablock need not be restricted to the same relative locations within their respective planes, as is shown in a second metablock 420 made up of blocks 422, 424, 426, and 428. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 5:
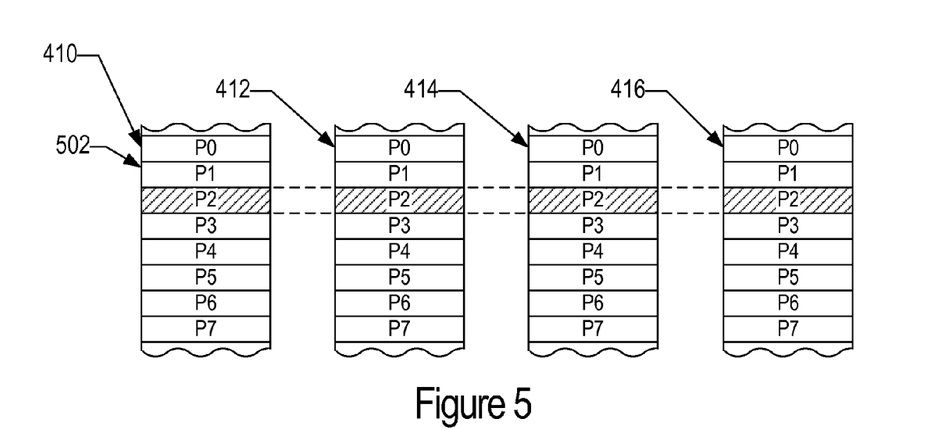
FIG. 5 is an expanded view of a portion of the physical memory of FIG. 4.

The individual blocks are in turn divided for operational purposes into pages of memory cells, as illustrated in FIG. 5. The memory cells of each of the blocks 410, 412, 414, and 416, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 502 is illustrated in FIG. 4, being formed of one physical page from each of the four blocks 410, 412, 414, and 416. The metapage 502, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material. As described below, SLC may be used for a high-usage or high endurance memory pool, while MLC may be used for a lower-usage or lower endurance memory pool.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 6:
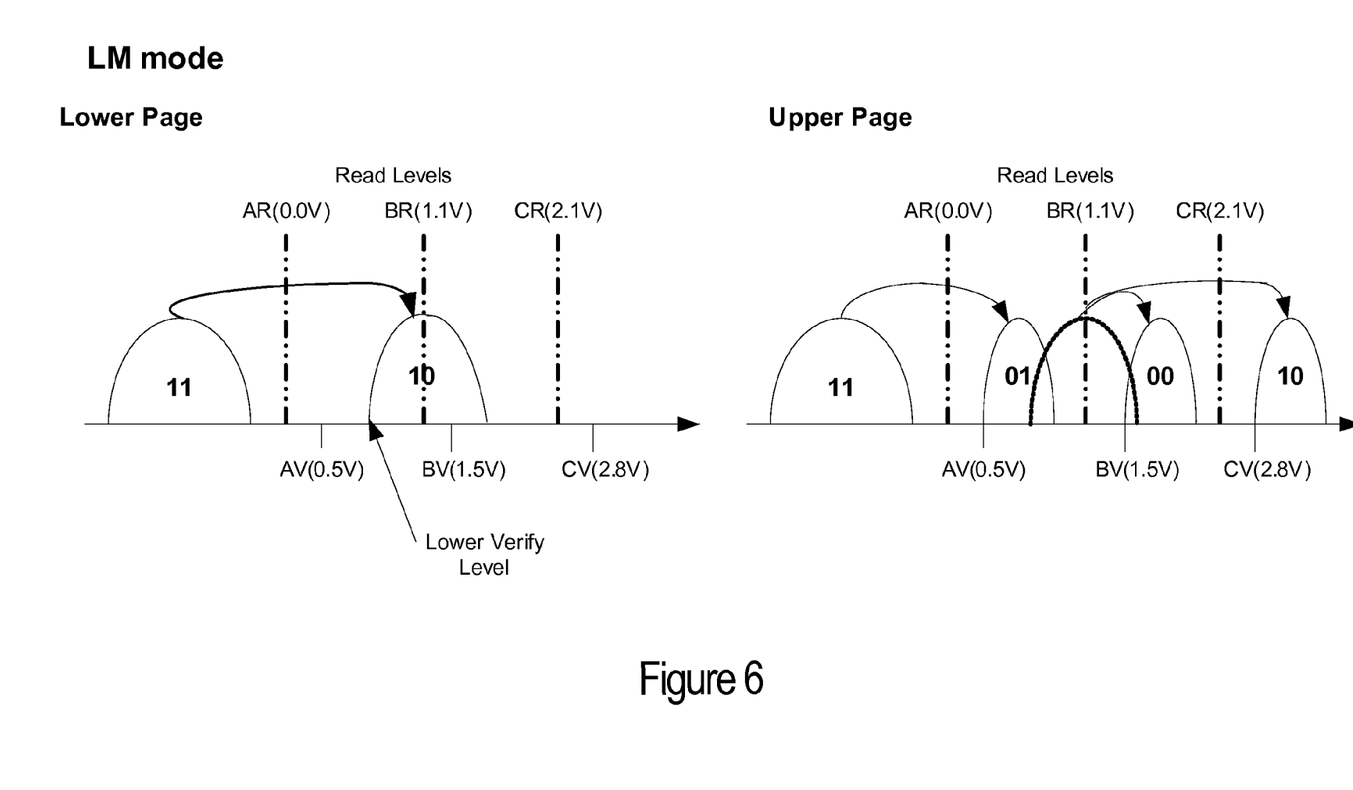
FIG. 6 is a diagram illustrating charge levels in a multi-level cell memory operated to store two bits of data in a memory cell.

FIG. 6 illustrates one implementation of the four charge levels used to represent two bits of data in a memory cell. FIG. 6 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

In one embodiment, the memory pools described below may be divided based on MLC and SLC memory. For example, there may be two pools, a high-usage pool of SLC memory and a low-usage pool of MLC memory. In other embodiments, there may be different number and types of pools (e.g. high, medium and low usage pools) and the pools may include different types of memory (e.g. both SLC and MLC). Using endurance simulations for different cards (e.g. different size flash memory) can be used to estimate usage patterns for different devices (e.g. a different type of smartphone). For example, different size Secure Disk (SD) cards can be tested in a first smartphone and a second smartphone. The simulation may identify and estimate the usage for different memory pools, including the usage patterns for each of the MLC and SLC memory. Exemplary data for a three year usage simulation is shown below as the number of times each block in different pools (MLC vs. SLC) is written and erased on average over a period of 3 years. The italicized values are an indication of a potentially problematic usage pattern. In other words, high usage (i.e. heavy wear) indicates a potential for a grown defect, so the card should be rated to handle that usage pattern.

TABLE 1

Endurance simulations for 3 year usage on different usage patterns

|  | 4 GB | | 8 GB | | 16 GB | | 32 GB | |
|---|---|---|---|---|---|---|---|---|
|  | MLC | SLC | MLC | SLC | MLC | SLC | MLC | SLC |
| 1st Phone | 2527 | 31021 | 956 | 9746 | 467 | 4860 | 235 | 1797 |
| 2nd Phone | — | — | 1287 | 19544 | 638 | 9841 | 321 | 3664 |

Based on the endurance simulations, endurance requirements may be determined for memory pools. For example, by comparing the evaluations of the usage of multiple smartphones for a 32 gigabyte (GB) SD card over a certain time period (e.g. three years) an endurance requirement can be determined that exceeds the maximum simulated usage patterns to prevent card failure. The following exemplary Table 2 illustrates the endurance requirements on the memory based on the exemplary simulations in Table 1 for the product to work without failing for a period of 3 years. Based on Table 2, the SLC endurance requirements for the 4 GB and 8 GB capacity are significantly higher than the 16 GB capacities.

TABLE 2

Endurance requirements on memory pools

|  | SLC Endurance Requirement | MLC Endurance Requirement |
|---|---|---|
| 4 GB | 50k | 3k |
| 8 GB | 30k | 3k |
| 16 GB | 20k | 3k |
| >=32 GB | 10k | 3k |

The endurance requirements illustrated in Table 2 are merely exemplary and may change over time. As the technology size continually decreases, the endurance may also decrease. Based on increasing usage and potentially decreasing endurance, the monitoring of wear and the allocation of spare blocks described below may be a way to reduce overall wear, reduce failure, and improve the lifetime of the memory. Finally, the smart dynamic wear balance between multiple memory pools that is described below may also reduce a cost of production and time to market.

Spare blocks may be allocated to one or more pools and allocated to compensate for grown defects. Traditionally, the spare blocks may be used/recycled within the same memory pool. If the spare blocks for a particular pool ran out of the pre-allocated spare blocks, the device (e.g. card) may go into read only mode and not be useful. The smart dynamic wear balancing may reallocate spare blocks between different pools.

Figure 7:
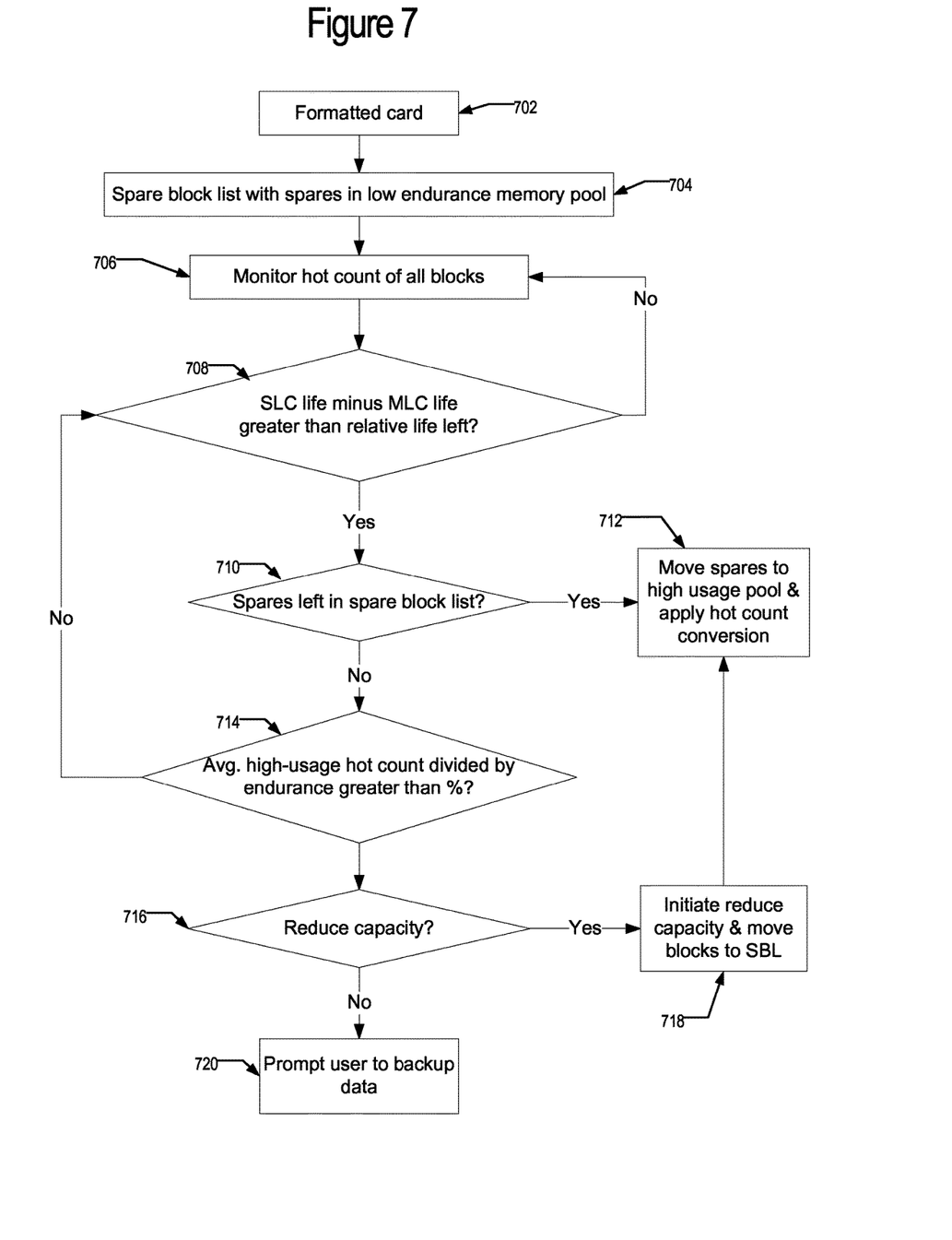
FIG. 7 is a flowchart illustrating smart dynamic wear balancing.

FIG. 7 is a flowchart illustrating smart dynamic wear balancing. In one embodiment the memory may be part of a memory card (e.g. SD card or flash memory stick) that is formatted in block 702. A spare block list (SBL) may include a listing of available spare blocks, which can be used to replace bad blocks (e.g. grown defects). In one embodiment, the spare block list may initially include all spare blocks in the low endurance memory pool (e.g. MLC) in block 704. In block 706, the hot count of all blocks is monitored. The hot count may be a measurement of memory usage, such as a number of times the block is accessed. In the example of two memory pools (SLC and MLC), an SLC life value is calculated as the average high usage (SLC) memory hot count divided by the high usage memory endurance limit. The high usage (SLC) endurance limit may be the values from Table 2 in one embodiment. Likewise, the MLC life value is calculated as the average low usage (MLC) memory hot count divided by the low usage memory endurance limit. The low usage (MLC) memory endurance limit may be the values from Table 2 in one embodiment. In block 708, the MLC life value is subtracted from the SLC life value and compared with a threshold, which may be referred to as a relative life left (RLL) value. In one example, the RLL value should be kept low (e.g. 0.3 or 0.4) to ensure that both pools are used equally. RLL may be a comparison value that represents an acceptable ratio between pools (e.g. SLC or MLC). When the SLC life minus MLC life is not greater than the RLL value, the monitoring of the hot count in block 706 continues. When the SLC life minus MLC life is greater than the RLL value, a determination is made as to whether there are spares left in the spare block list in block 710. If there are spares, then those spares can be reallocated from the low usage pool to the high usage pool in block 712. This reallocation of spare blocks from the low usage pool may occur one at a time until the difference is below the threshold or until there are no more spares available.

When blocks are reallocated from one memory pool to another, the SLC life value is updated and compared with a threshold % as in block 714. For example, the % threshold may be 99% and when the SLC life value is less than 99%, the SLC life minus MLC life is compared with the RLL value as in block 708. When the SLC life is greater than the % threshold, the capacity may be reduced to compensate for bad blocks as in block 716. When the decision is made to reduce the capacity, the reduction in capacity is used to move blocks to the spare block list in block 718. If the capacity is not reduced, then the user may be prompted to backup data in block 720 and may be prompted to change the device or memory.

FIG. 7 is merely one example of a process for dynamically managing wear balancing between memory pools. Block wear may include an amount of usage of a block (e.g. a hot count of the block). In alternative embodiments, there may be more memory pools from which the spare blocks are re-allocated. The memory pools may reflect an amount of usage. For example, three memory pools may be high-usage, medium-usage, and low-usage.

Figure 8:
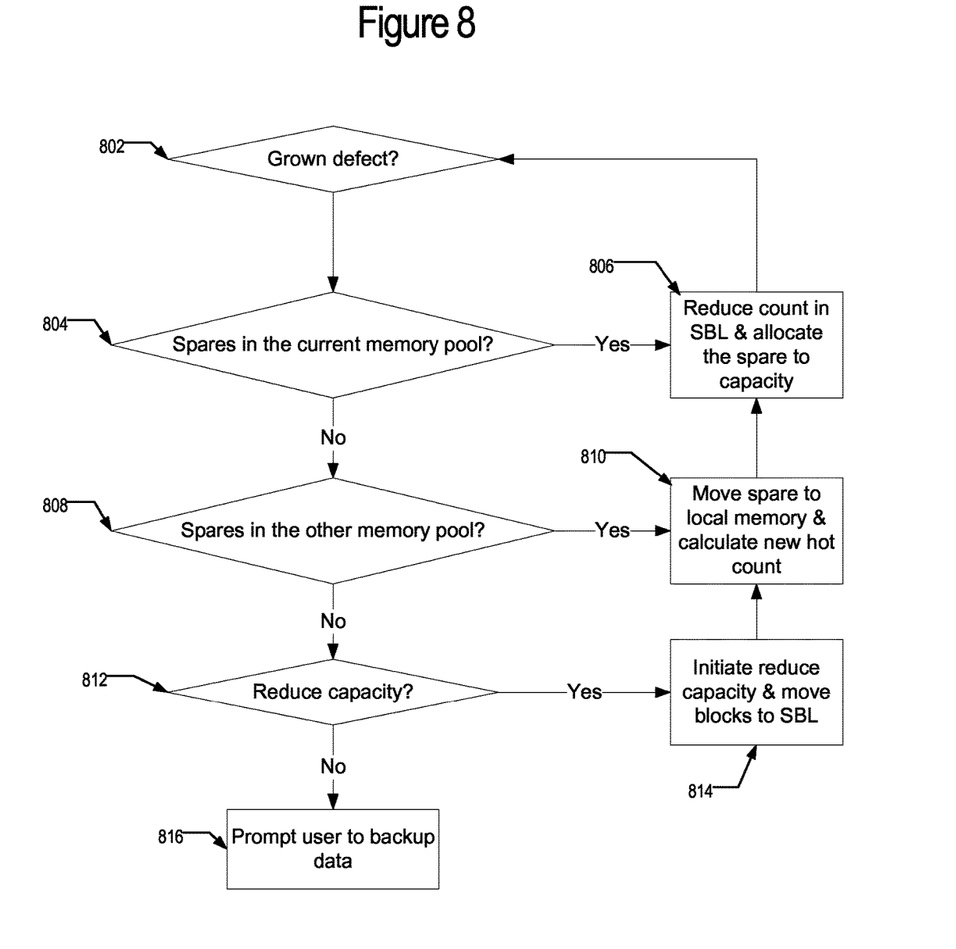
FIG. 8 is a flowchart illustrating handling grown defects.

FIG. 8 is a flowchart illustrating handling grown defects. In block 802, a grown defect is detected in the current or local memory pool. In block 804, if there are spares in the current memory pool, then the spare block list (SBL) is reduced and a spare is allocated to capacity in block 806. If there are no spares in the current memory pool in block 804, then spares are checked in the other memory pool (or one of the other memory pools) as in block 808. When there are spares in the other memory pool, a spare is moved to the local memory pool and a new count is calculated in block 810. When there are no spares in the other memory pool in block 808, when the capacity of the device may be reduced in block 812. When the capacity is reduced, blocks are moved to the spare block list from the capacity of the card as in block 814. When the capacity is not reduced, then the user may be prompted to backup data in block 816 and maybe prompted to change the device or memory. In particular, the user may be given the option to choose between longer card life rather than card capacity, and if the user chooses longer card life, some capacity may be moved to the spare block list to compensate for grown defects.

As described, the monitoring of usage may be dynamically specific to particular users or devices. In particular, the re-allocation of spare blocks may be dynamic in the sense that the usage is actively monitored and the memory pool spare block allocation can be adjusted in real-time as necessary.

Figure 9:
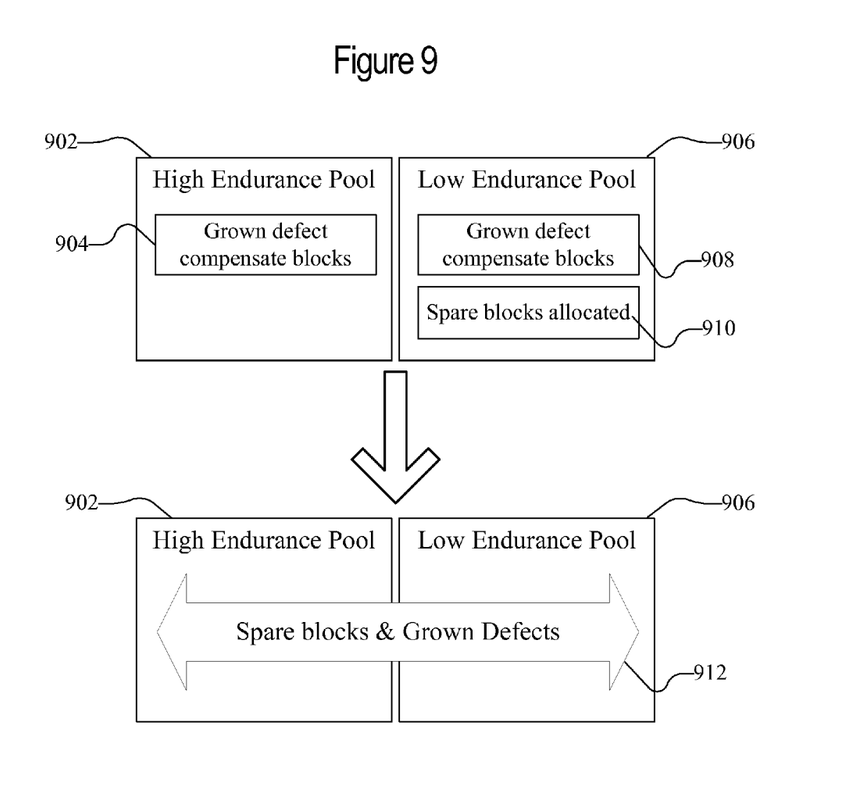
FIG. 9 is a diagram illustrating reallocation.

FIG. 9 is a diagram illustrating reallocation. In particular, FIG. 9 represents a memory device or card that includes a high endurance pool of blocks 902 and a low endurance pool of blocks 906. There may be grown defect compensate blocks 904 in the high endurance pool 902 and grown defect compensate blocks 908 in the low endurance pool 906. Initially, the spare blocks allocated 910 may be in the low endurance pool 906. The compensate blocks may be a fixed number of blocks that are allocated to both the memory pools during format to compensate for the grown defects and may then be expected to be used/recycled within the same pool. However, with a fixed number of blocks, if either of these pools run out of these pre-allocated blocks, the device/card may go into read only mode and may no longer practically useful to the user. Accordingly, reallocation of blocks (as shown below the arrow) may prevent this problem. In particular, the high endurance pool 902 and the low endurance pool 906 are illustrated with reallocation of spare blocks 912. In particular, the spare blocks may be allocated between the high endurance pool of blocks 902 and the low endurance pool of blocks 906. This reallocation of spare blocks may be smart and dynamic between the different pools in the memory by actively monitoring the block wear and grown defects in each pool, which may efficiently use the remaining available spare blocks. The different pools within which the block sharing is being done can be either different or same type of memory.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A flash memory device comprising:
a non-volatile storage having an array of memory blocks storing data; and
a controller in communication with the non-volatile storage, the controller is configured for:
categorizing the array of memory blocks into two or more memory pools comprising at least one low-usage memory pool characterized by a first endurance limit and at least one high-usage memory pool characterized by a second endurance limit different from the first endurance limit, wherein spare blocks of the array of memory blocks are allocatable to one or more of the two or more memory pools;
monitoring usage of the array of memory blocks by comparing a first ratio between a first average access counts for the memory blocks in the at least one low-usage memory pool and the first endurance limit with a second ratio between a second average access counts for the memory blocks of the at least one high-usage memory pool and the second endurance limit;
subtracting the first ratio from the second ratio to obtain a difference between the second ratio and the first ratio; and
re-allocating the spare blocks of the array of memory blocks between the two or more memory pools when the difference between the second ratio and the first ratio is larger than a predetermined threshold.

2. The flash memory device of claim 1 wherein the at least one low-usage memory pool comprises multi-level cell (MLC) memory and the at least one high-usage memory pool comprises single-level cell (SLC) memory.

3. The flash memory device of claim 2 wherein the re-allocating the spare blocks of the array of memory blocks comprises transferring the spare blocks of the array of memory blocks from the MLC memory to the SLC memory.

4. The flash memory device of claim 1 wherein the re-allocating the spare blocks of the array of memory blocks comprises allocating the spare blocks of the array of memory blocks from the at least one low-usage memory pool to the at least one high-usage memory pool.

5. The flash memory device of claim 1 wherein the first ratio and the second ratio comprise an amount of wear on the array of memory blocks.

6. The flash memory device of claim 1 wherein the categorizing of the array of memory blocks comprises categorizing the array of memory blocks into the at least one high-usage memory pool, a medium-usage memory pool, and the at least one low-usage memory pool.

7. A flash memory device comprising:
a non-volatile storage having an array of memory blocks storing data; and
a controller in communication with the non-volatile storage, the controller is configured for:
categorizing the array of memory blocks into two or more memory pools comprising at least one low-usage memory pool characterized by a first endurance limit and at least one high-usage memory pool characterized by a second endurance limit different from the first endurance limit, wherein spare blocks of the array of memory blocks are allocatable to one or more of the two or more memory pools;
monitoring usage of the array of memory blocks;
comparing a first ratio between a first average access counts for the array of memory blocks in the at least one low-usage memory pool and the first endurance limit with a second ratio between a second average access counts for the array of memory blocks in the at least one high-usage memory pool and the second endurance limit;
subtracting the first ratio from the second ratio to obtain a difference between the second ratio and the first ratio; and
re-allocating the spare blocks of the array of memory blocks from the at least one low-usage memory pool to the at least one high-usage memory pool when the difference between the second ratio and the first ratio is larger than a predetermined threshold.

8. The flash memory device of claim 7, wherein the predetermined threshold comprises a relative life left that ensures that both of the at least one low-usage memory pool and the at least one high-usage memory pool have equal usage.

9. The flash memory device of claim 8, wherein the relative life left comprises a comparison between remaining life for each of the at least one low-usage memory pool and at least one high usage memory pool.

10. A method for monitoring rewrites in a flash memory device comprising:
in a non-volatile storage device having a controller and memory blocks, the controller:
initially allocating all spare blocks of the memory blocks to a lower usage memory pool of a plurality of memory pools, the plurality of memory pools comprising the lower usage memory pool characterized by a first endurance limit and a higher usage memory pool characterized by a second endurance limit different from the first endurance limit;
tracking a first ratio between a first average access counts for the memory blocks of the lower usage memory pool of the plurality of memory pools and the first endurance limit with a second ratio between a second average access counts for the memory blocks of the higher usage memory pool of the plurality of the memory pools and the second endurance limit;
subtracting the first ratio from the second ratio to obtain a difference between the second ratio and the first ratio; and
re-allocating the spare blocks of the memory blocks between the plurality of memory pools when the difference between the second ratio and first ratio is larger than a predetermined threshold.

11. The method of claim 10 wherein the lower usage memory pool comprises multi-level cell (MLC) memory and the higher usage memory pool comprises single-level cell (SLC) memory.

12. The method of claim 11 wherein the re-allocating comprises transferring the spare blocks of the memory blocks from the MLC memory to the SLC memory.

13. The method of claim 10 wherein the re-allocating the spare blocks of the memory blocks comprises allocating the spare blocks of the memory blocks from the lower usage memory pool to the higher usage memory pool.

14. The method of claim 10 wherein the predetermined threshold comprises a relative life left that ensures that both of the lower usage memory pool and the higher usage memory pool have equal usage, wherein the relative life left comprises a comparison between remaining relative life for each of the lower usage memory pool and the higher usage memory pool.

15. The method of claim 10 wherein the plurality of memory pools further comprises the higher usage memory pool, a medium-usage memory pool, and the lower usage memory pool, further wherein the re-allocating is to those memory pools with higher usage.

16. The method of claim 15 wherein the spare blocks of the memory blocks from the lower usage memory pool are re-allocated to at least the medium-usage memory pool, and where the spare blocks of the memory blocks from the medium-usage memory pool are re-allocated to the higher usage memory pool.

17. The method of claim 10 wherein the the first ratio and second ratio comprise an amount of wear on the memory blocks.

* * * * *